(12) United States Patent
Han et al.

(10) Patent No.: US 10,103,001 B2
(45) Date of Patent: Oct. 16, 2018

(54) DOUBLE-TILT IN-SITU MECHANICAL SAMPLE HOLDER FOR TEM BASED ON PIEZOELECTRIC CERAMIC DRIVE

(71) Applicant: BEIJING UNIVERSITY OF TECHNOLOGY, Beijing (CN)

(72) Inventors: Xiaodong Han, Beijing (CN); Jianfei Zhang, Beijing (CN); Mao Shengcheng, Beijing (CN); Yadi Zhai, Beijing (CN); Xiaodong Wang, Beijing (CN); Zhipeng Li, Beijing (CN); Taonan Zhang, Beijing (CN); Dongfeng Ma, Beijing (CN); Xiaochen Li, Beijing (CN); Ze Zhang, Beijing (CN)

(73) Assignee: BEIJING UNIVERSITY OF TECHNOLOGY, Beijing (CN)

( * ) Notice: Subject to any disclaimer, the term of this patent is extended or adjusted under 35 U.S.C. 154(b) by 73 days.

(21) Appl. No.: 15/387,534

(22) Filed: Dec. 21, 2016

(65) Prior Publication Data
US 2017/0301511 A1    Oct. 19, 2017

(30) Foreign Application Priority Data

Apr. 17, 2016   (CN) .......................... 2016 1 0237986
Apr. 17, 2016   (CN) ..................... 2016 2 0321508 U

(51) Int. Cl.
*H01J 37/20*   (2006.01)
*H01J 37/26*   (2006.01)

(52) U.S. Cl.
CPC .............. *H01J 37/20* (2013.01); *H01J 37/26* (2013.01); *H01J 2237/2802* (2013.01)

(58) Field of Classification Search
CPC .... H01J 37/20; H01J 37/26; H01J 2237/2001; H01J 2237/26; H01J 2237/2802;
(Continued)

(56) References Cited

U.S. PATENT DOCUMENTS

| 2007/0012112 | A1* | 1/2007 | Kim ....................... G01H 9/004 73/594 |
| 2007/0063148 | A1* | 3/2007 | Miyazaki ................ H01J 37/20 250/442.11 |
| 2013/0105706 | A1* | 5/2013 | Han ........................ G01N 23/04 250/442.11 |

* cited by examiner

*Primary Examiner* — David E Smith
*Assistant Examiner* — Hsien Tsai
(74) *Attorney, Agent, or Firm* — J.C. Patents

(57) ABSTRACT

A double-tilt in-situ mechanical sample holder for TEM based on piezoelectric ceramic drive belongs to the field of material microstructure-mechanical properties in-situ characterization, and it comprise two parts of sample holder shaft body and piezoelectric ceramic drive system. The sample holder shaft body comprise tilt stage, sample holder, linear stepping motor, drive rod, drive linkage. The piezoelectric ceramic drive system comprise piezoelectric ceramic loading stage, piezoelectric ceramic, connecting base and the sample loading stage realizing stretch or compression function. The double-axis tilt of the samples in X and Y axis directions is realized by the reciprocating motion back and forth of the drive rod driven by the linear stepping motor. The stretch or compression of the samples is realized by applying voltage on the piezoelectric ceramic to generate displacement and push the sample loading stage by the connecting base. The invention coordinating with high resolution TEM realizes the observation of the microstructure in atomic and even sub angstrom scales, and at the same time it ensures the controllable deformation of nanomaterials, further realizes the integrative research on the material microstructure-mechanical properties and reveals the deformation mechanism of the materials.

5 Claims, 4 Drawing Sheets

Figure 1:
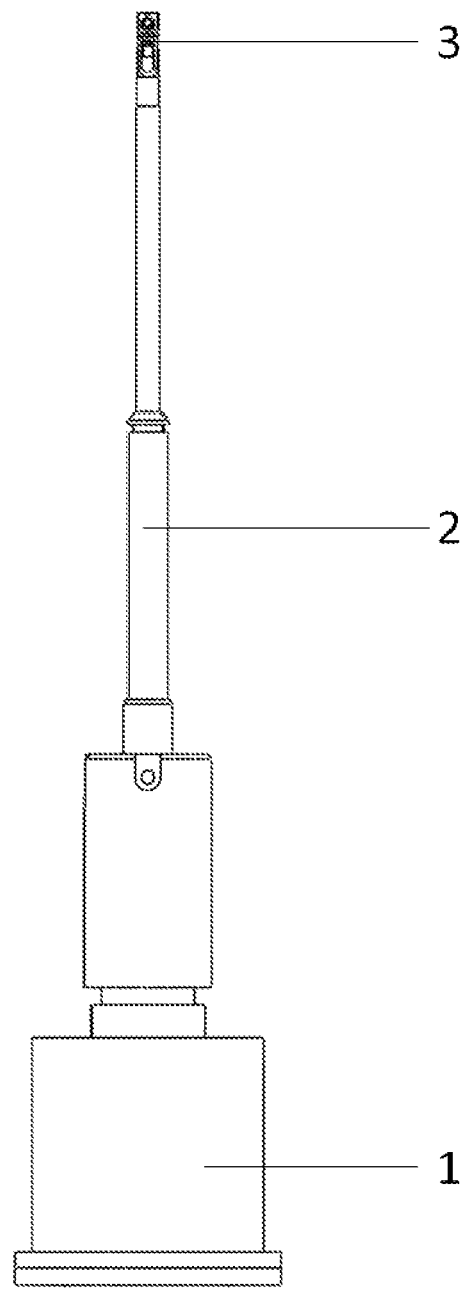

(58) Field of Classification Search
CPC ..... H01J 2237/20207; H01J 2237/2007; H01J 2237/20214; H01J 2237/206; H01J 2237/2065; H01J 2237/2062; G21K 5/08; G02B 21/26
See application file for complete search history.

DOUBLE-TILT IN-SITU MECHANICAL SAMPLE HOLDER FOR TEM BASED ON PIEZOELECTRIC CERAMIC DRIVE

CROSS-REFERENCE TO RELATED APPLICATION

This application claims the priority benefit of Chinese application serial No. 201610237986.3, filed on Apr. 17, 2016 and Chinese application serial No. 201620321508.6, filed on Apr. 17, 2016. The contents of the two Chinese applications are hereby incorporated by reference in their entirety and made a part of this specification.

TECHNICAL FIELD

The invention relates to a double-axis tilt in-situ mechanical sample holder for TEM based on piezoelectric ceramic drive, coordinating with TEM, which realizes the in-situ observation of microstructure evolvement of materials in the process of stretch deformation in atomic or even sub angstrom scale under the condition of double-axis tilt. In the process of stretch deformation, the drive displacement can be controlled precisely, and the invention belongs to the field of transmission electron microscope accessories.

BACKGROUND ART

The development of material science is one of the important factors of national scientific and technological progress. The advantages and disadvantages of the structural materials performance are mainly determined by their mechanical properties, including shock resistance of the materials, fatigue properties and plastic manufacturing capability. In order to develop new type and high performance materials, the deformation mechanism of the materials in nano, atomic or even sub angstrom scale should be understood in depth. Transmission electron microscopy (TEM) is one of the important means to study material microstructure, and by non TEM in-situ study method, some researchers cut out the materials in different deformation stage respectively as samples and observe their microstructure, thus infer the deformation mechanism of the materials; due to the limit that the observation range (in nano scale) and observation area in TEM are not the same area, sometimes the accurate deformation mechanism of the material is hard to be obtained. In recent years, some researchers and equipment manufacturers devote to develop in-situ TEM deformation technology, by applying force field on the samples in the TEM, in-situ observation of microstructure evolvement of the same area of the samples is realized, which provides a favorable means to study the elastic and plastic deformation mechanism of the materials.

At present, the drive modes applying stress load to micro and macro samples mainly comprise: electrostatic drive, memory alloy drive, piezoelectric drive, fluid drive, electromagnetic drive and thermal drive et. al. Therein electrostatic drive and fluid drive are not suitable for TEM due to a larger size. The drive force of the electromagnetic drive is less and magnetic and not suitable for TEM. The outputs of force and displacement of memory alloy drive are unstable and also not suitable for TEM. At present commercialized in-situ mechanical sample holders for TEM are mainly driven by the modes of piezoelectric ceramic drive, and typical commercialized products include: 671 and 654 type mechanical sample holders of American GATAN company, PI95 type mechanical sample holder of American Hysitron company et. al. Piezoelectric ceramic with three-dimensional drive and high-precision is placed at the through hole of the sample holder shaft by these commercialized sample holders to realize the stretch and compression of the samples; its advantages are: experimental convenience, no effect from temperature, accurate control of deformation, quantitative test of sample pressure; but the piezoelectric ceramic is located at the back end of the shaft, limiting the function of tilt of the sample holder in the direction of Y axis, so it is difficult to ensure electron beam incidence along the low index crystal face of the sample, and further clear electron diffraction patterns and high resolution images in atomic scale or sub angstrom scale cannot be obtained.

In order to solve the limit that the double-axis tilt of commercialized sample holders cannot be realized, many research groups have developed in-situ mechanical sample holders or drive modes for TEM by which double-axis tilt can be applied. The bimetallic strip driver for TEM was researched and developed by Han Xiaodong et. al from Beijing University of Technology (Patent No.: CN 200910086803), by the principle of thermal expansion drive the function of double-axis tilt is realized while deformed materials are stretched by large strain, thus clear atomic lattice images and high quality diffraction images are obtained. The advantages of this method are in that: (1) The load of surface internal force is realized under the premise of double-axis tilt (X:±30°/±20°, Y:±30°/±20°) ensured; (2) Its stretch velocity can be controlled very well by adjusting temperature controller and the regulation of $10^{-5}$-$10^{-1}S^{-1}$ of strain rate can be realized; (3) large deformational behavior of bimetallic strip can be realized when the temperature is below 100° C., thus large strain stretch experiment on the samples can be carried out. The disadvantage of this method are in that: (1) bimetallic strip tensioner must be driven by temperature control, and the temperature effect is introduced while the deformation mechanism of the material is studied, which brings the difficult to study the deformation mechanism of some temperature sensitive materials; (2) the drive force outputted is less and difficult to drive the samples with large size, high elastic modulus.

Han Xiaodong et. al from Beijing University of Technology developed the in-situ deformation technology for TEM based on V shape beam thermal drive (Patent No.: ZL 2015 2 0191419.X). Its advantages are: the displacement outputted is large, and oversized deformation stretch of the samples can be realized. Its uniaxiality is good, and the shear stress will not be generated in the horizontal direction of the samples. But at the same time, some disadvantages exist, for example: the realization of the drive depends on temperature as well and it is difficult to study the deformation mechanism of some temperature sensitive materials, and due to its higher drive temperature, it is not suitable to be used coordinating with mechanical sensor, which affect the quantitative output of mechanical properties of samples.

CONTENTS OF THE INVENTION

Aiming to the present problems, the invention provides a double-axis tilt in-situ mechanical sample holder for TEM based on piezoelectric ceramic drive, by which stretch deformation of the sample in TEM and in-situ observation of microstructure evolvement of the materials in the process of stretch can be realized. Piezoelectric ceramic driver can provide larger drive force, realizing controllable drive displacement. The integrative research on the correlation of mechanical property-material microstructure in nano, atomic and even sub angstrom scale can be realized by the sample holder coordinating with TEM, and clear selective electron diffraction patterns and high resolution images of low index zone axis of any grains can be obtained.

In order to realize the above purpose, the invention is realized by the following technical scheme:

A double-axis tilt in-situ mechanical sample holder for TEM based on piezoelectric ceramic drive, characterized in that it comprise two parts: sample holder shaft body and piezoelectric ceramic drive system; the part of sample holder shaft body comprise sample holder shaft, front-end of shaft, tilt stage, back-end of shaft, linear stepping motor, drive rod, drive linkage; the part of piezoelectric ceramic drive system comprise piezoelectric ceramic loading stage, piezoelectric ceramic, connecting base and the sample loading stage realizing stretch or compression function;

The back-end of the sample holder, the sample holder shaft and the front-end of sample holder are fixed together; linear stepping motor is fixed on the back-end of sample holder by sealing screw; the center of sample holder shaft is provided with a through hole to place the drive rod, and the back-end of drive shaft is connected with the thread of linear stepping motor; the front-end of shaft and the tilt stage are fixed by the tilt axis, and the tilt axis crosses the two tilt axis holes at both sides of the tilt stage and is fixed to the tilt stage.

The whole tilt stage is a bilaterally symmetric structure, a combination of U shape structure and a boss, and the structure is a bilaterally symmetric structure, comprising horizontal part and tilted part at θ angle to the horizontal part, and θ angle is 30-45 degrees; a rotary axis hole is arranged at the back end of the tilted part; one side of the horizontal part of the boss is provided with a boss slot, and the middle is provided with a through hole convenient for electron beam to permeate; the horizontal part of the boss is embedded between the U shape structure, and the fixed axis of drive rod is at one end of the linkage, and the rotary axis is at the other side, the slot provided at the middle of the horizontal part of the boss is connected with the drive rod slot by the rotary axis and the linkage; two symmetric and through motion guide groove are designed at both sides of the front-end of sample holder shaft, and the fixed axis of drive rod is arranged in the motion guide groove to fix the drive rod, restricting the drive rod to take a reciprocating motion back and forth in straight under the drive of linear stepping motor, further ensuring the tilt stage to rotate around the tilt axis.

A via hole is arranged at the front end of piezoelectric ceramic loading stage, and a screw hole is arranged at the front end of the tilt stage, and the piezoelectric ceramic loading stage and the tilt stage are fixed together up and down, and piezoelectric ceramic and piezoelectric ceramic loading stage are fixed; one end of the connecting base is connected with one end of piezoelectric ceramic and the other end of the connecting base is connected with the sample loading stage.

The horizontal part of the boss is embedded between U shape tilt stage, the fixed axis of drive rod is at one end of the linkage, and the rotary axis is at the other end, the slot provided at the middle of the horizontal part of the boss is connected with the drive rod slot by the rotary axis and the linkage.

Two symmetric and through motion guide groove are designed at both sides of the front-end of sample holder shaft, and the fixed axis of drive rod is arranged in the motion guide groove to fix the drive rod, restricting the drive rod to take a reciprocating motion back and forth in straight under the drive of linear stepping motor, further ensuring the tilt stage to rotate around the tilt axis.

Further, the sample loading stage is integrally formed by bulk silicon etching technology, wherein the thickness of the substrate is 400 μm, and the size of outer frame is 3*3 mm$^2$, and the inside is "I" type inner frame, and the substrate is connected with a support beam. The other end of the support beam is connected with mass blocks, and the mass blocks are two rectangular flat plates with hook-like front ends. The triangle sample carrying platform is etched on the hook-like area of the mass blocks. The thickness of the support beam, the mass blocks and the sample carrying platform are all 60 μm.

Further, the sample loading stage and the piezoelectric ceramic loading stage are fixed by the mode of adhesion. The sample loading stage is kept horizontal with the drive surface of the piezoelectric ceramic, ensuring the force applied on the samples is uniaxial stretch force. The tail end of the mass blocks is connected with the connecting base by the mode of adhesion. Piezoelectric ceramic loading stage, piezoelectric ceramic, connecting base and sample stage are fixed into an integrated platform, convenient to be fixed and disassembled on tilt stage by screw.

Further, the middle of the sample holder shaft is provided with a through hole matching the drive rod to ensure the drive rod and piezoelectric ceramic wire to cross, and the motor is fixed at the back end of the shaft, and the tail end of the shaft is arranged with electrical interface to ensure vacuum.

The advantages of the invention are in that TEM in-situ tensile test under the atomic lattice resolution and large drive force tensile test can be carried out, at the same time the drive force and the driving displacement can be precisely controlled. Selective electron diffraction patterns and high quality and high resolution images are obtained, while the in-situ mechanical properties of the sample are obtained, thus the process of comprehensive microstructure change of the samples is obtained. The device can be used in general transmission electron microscopes, and its universality is wide.

DESCRIPTION OF APPENDED DRAWINGS

Figure 2:
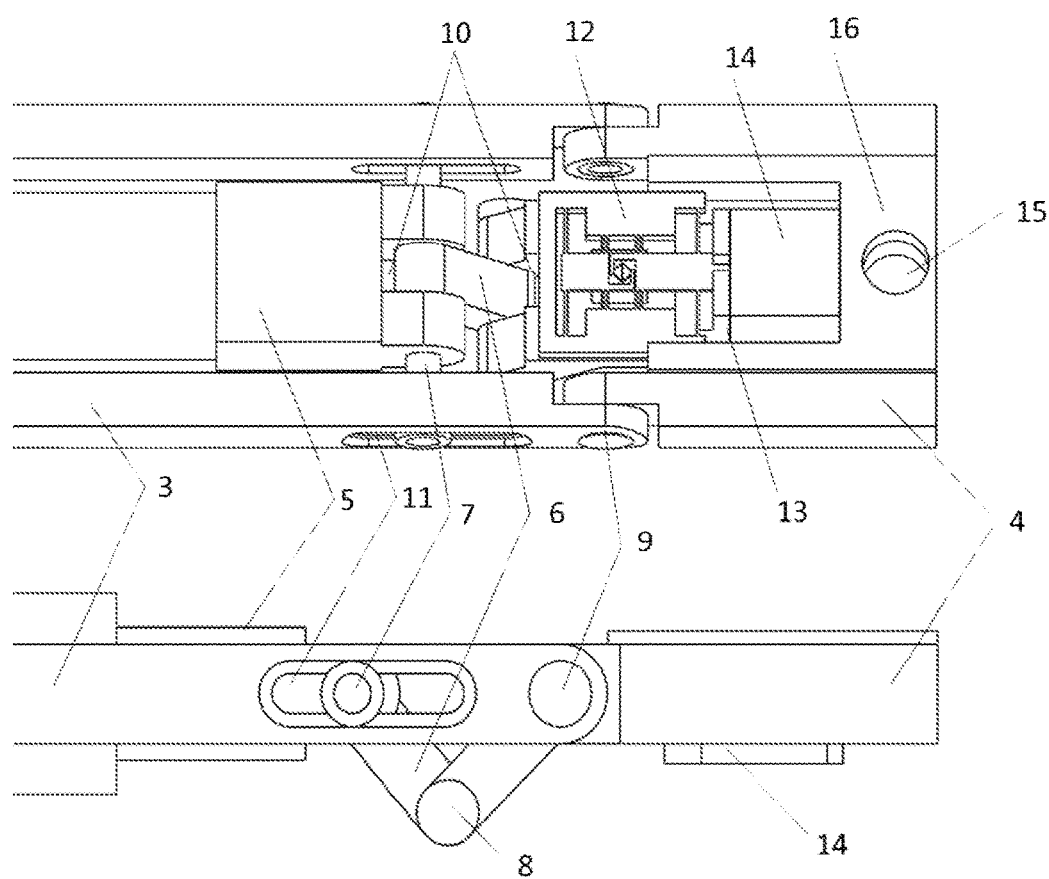
Figure 3:
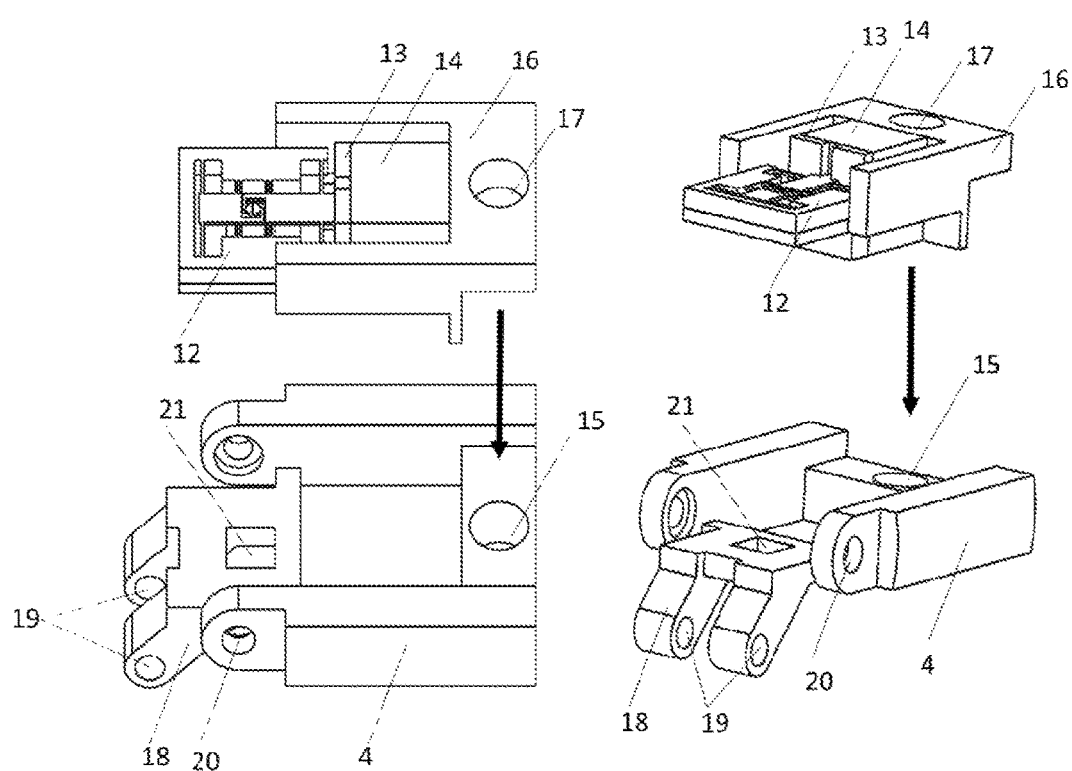
Figure 4:
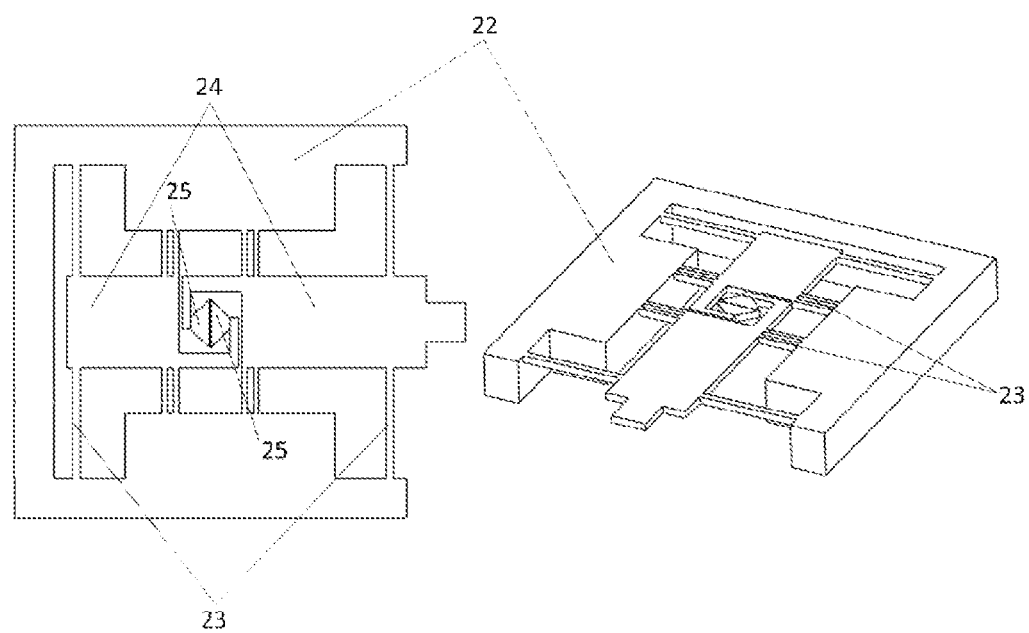

FIG. 1 Schematic diagram of the whole structure of stretch sample holder driven by double-tilt in-situ piezoelectric ceramic for TEM;

FIG. 2 Schematic diagram of the amplified structure of the front end of stretch sample holder driven by double-tilt in-situ piezoelectric ceramic for TEM;

FIG. 3 Schematic diagram of the assembly of the piezoelectric ceramic stretch stage and the tilt stage;

FIG. 4 Schematic diagram of the amplified structure of the sample loading stage

The surfaces in the diagrams are illustrated as follows:

1 back-end of sample holder 2 sample holder shaft 3 front-end of shaft 4 tilt stage 5 drive rod 6 linkage 7 fixed axis of drive rod 8 rotary axis 9 tilt axis 10 slot 11 motion guide groove 12 sample loading stage 13 connecting base 14 piezoelectric ceramic 15 screw hole 16 piezoelectric ceramic loading stage 17 via hole 18 boss 19 rotary axis hole 20 tilt axis hole 21 square hole 22 outer frame of substrate 23 support beam 24 mass block 25 sample carrying platform

DESCRIPTION OF THE PREFERRED EMBODIMENTS

A screw hole used to fix piezoelectric ceramic loading stage was prearranged at one end of the tilt stage. Piezoelectric ceramic loading stage was located above the tilt stage, coordinating closely with the tilt stage, the upper end of which was arranged with screw hole convenient to be fixed to the tilt stage by the screw.

The tilt stage was arranged with tilt axis hole, by which the tilt stage was connected with the front-end of sample holder shaft. The bottom surface was arranged with the boss. The boss comprised horizontal part and tilted part at θ angle to the horizontal part, θ angle was 30-45 degrees; a rotary axis hole was arranged at the back end of the tilted part, and the boss was a bilaterally symmetric structure; the horizontal part of the boss was embedded between the U shaped structure, and the fixed axis of drive rod was at one end of the linkage, and rotary axis was at the other side, the slot provided at the middle of the horizontal part of the boss was connected with the drive rod slot by the rotary axis and the linkage. Two symmetric through motion guide groove were designed at the both sides of the front-end of the sample holder shaft, and the fixed axis of drive rod was arranged in the motion guide groove to fix the drive rod, restricting the drive rod to take a reciprocating motion back and forth in straight under the drive of linear stepping motor, further ensuring the tilt stage to rotate around the tilt axis.

The patent was further illustrated by referring the appended drawings, and the example embodiments of the patent were shown in the appended drawings.

The back-end of sample holder 1, the sample holder shaft 2 and the front end of shaft 3 were fixed together. The linear stepping motor was fixed on the back-end of sample holder 1 by the sealing screw. The center of the sample holder shaft 2 was provided with a through hole adapting the dimension of the drive rod 5, and the back end of the drive rod 5 was connected with the thread of the linear stepping motor. The front-end of the shaft 3 and the tilt stage 4 were fixed by the tilt axis, and the tilt axis 9 crossed the two tilt axis holes 20 at both sides of the tilt stage 4 and was fixed to the tilt axis holes 20 by welding.

The whole tilt stage 4 was a bilaterally symmetric structure, a combination of U shape structure and a boss, the structure was a bilaterally symmetric structure, comprising horizontal part and tilted part at θ angle to the horizontal part, θ angle was 30-45 degrees; a rotary axis hole was arranged at the back end of the tilted part; one side of the horizontal part of the boss was provided with the boss slot, and the middle was provided with the through hole 21 convenient for electron beam to permeate; the horizontal part of the boss was embedded between the U shape structure, the fixed axis of the drive rod was at one end of the linkage, and the rotary axis was at the other side, the slot provided at the middle of the horizontal part of the boss was connected with the drive rod slot by the rotary axis and the linkage. Two symmetric through motion guide groove were designed at the both sides of the front end of the sample holder shaft, and the fixed axis of the drive rod was arranged in the motion guide groove to fix the drive rod, restricting the drive rod to take a reciprocating motion in front and back in straight under the drive of linear stepping motor, further ensuring the tilt stage to rotate around the tilt axis.

A via hole 17 was arranged at the front end of the piezoelectric ceramic loading stage 16, and a screw hole 15 was provided at the front end of the tilt stage, the piezoelectric ceramic loading stage 16 and the tilt stage were fixed together up and down, piezoelectric ceramic and piezoelectric ceramic loading stage were fixed by the mode of adhesion. One end of the connecting base was connected with one end of the piezoelectric ceramic and the other end of the connecting base was connected with the sample loading stage.

The boss 18 was connected with the drive linkage 6 together by the rotary axis hole 19, and rotary axis 8 was inserted into rotary axis hole 19, and drive linkage 6 was connected together with the drive rod 5 by the rigid fixed axis of drive rod 7, and the fixed axis of the drive rod 7 was fixed in the motion guild grooves 11 on both sides of the front-end of the sample holder shaft 3 and took a straight motion back and forth along the motion guild grooves 11. The drive linkage 6, the boss slot and the slot provided on one end of the drive rod 5 were connected by the rotary axis 8.

The drive rod 5 connected with the linear stepping motor as the drive part took a straight motion by the function of restraint of the fixed axis of the drive rod 7 and the motion guide groove 11 in vertical direction, while pushed the connected drive linkage 6, and drove tilt stage 4 on the front end to rotate centered on the tilt axis 9.

The front end of piezoelectric ceramic loading stage 16 was arranged with a M1.2 via hole 17, while the front end of the tilt stage 4 was arranged a M1.2 screw hole 15, and both of them could be fixed and disassembled by the screw, and the piezoelectric ceramic 14, a cube of 2*2*2 mm$^3$, was fixed to the piezoelectric ceramic loading stage 16 by the mode of adhesion. Connecting base 13 was processed by high-precision machining and was connected on one end of piezoelectric ceramic 14, and the other end of the connecting base 13 was connected with the sample loading stage 12.

The sample loading stage 12 was integrally formed by bulk silicon etching technology and its specific structure was as shown in FIG. 4, wherein the size of the outer frame of the substrate 22 was 3*3 mm$^2$, and the thickness was 400 μm, and the inside was "I" type inner frame, the substrate was connected with the support beam 23. The other end of the support beam 23 was connected with the mass block 24, and the mass block 24 were two rectangular flat plates with hook-like front ends. The triangle sample carrying platform 25 was etched on the hook-like area of the mass block 24. The thickness of the support beam 23, the mass block 24 and the sample carrying platform 25 were all 60 μm. The sample loading stage 12 was fixed to the piezoelectric ceramic loading stage 16 by the mode of adhesion, ensuring triangle sample carrying platform 25 is at the center of the square hole 21 below the piezoelectric ceramic loading stage. Piezoelectric ceramic loading stage, piezoelectric ceramic, connecting base and sample stage were fixed into an integrated platform, convenient to be fixed and disassembled on tilt stage by the screw (shown in FIG. 3).

In the process of TEM in-situ tensile test, the bulk sample or nanowire sample prepared by FIB was loaded between two triangle sample carrying platforms 25. At the same time the piezoelectric ceramic 14 was applied with 0-120 V voltage, by this time the piezoelectric ceramic 14 pushed the connecting base 13 and sample loading stage 12, leading the mass block 24 to drive the left sample carrying platform 25 to move to the left, realizing the tensile deformation of the TEM samples loaded at the middle of the sample carrying platform.

What is claimed is:

1. A double-tilt in-situ mechanical sample holder for TEM based on piezoelectric ceramic drive, comprising a sample holder shaft body and a piezoelectric ceramic drive system; wherein the sample holder shaft body comprises a sample holder shaft, a front-end of shaft, a tilt stage, a back-end of sample holder, a linear stepping motor, a drive rod, a drive linkage; the piezoelectric ceramic drive system comprises a piezoelectric ceramic loading stage, a piezoelectric ceramic block, a connecting base and a sample loading stage realizing stretch or compression function;

the back-end of sample holder, the sample holder shaft and the front-end of shaft are fixed together; the linear stepping motor is fixed on the back-end of sample holder; the center of the sample holder shaft is provided with a through hole to place the drive rod, and a back-end of the drive rod is connected with the linear stepping motor; the front-end of shaft and the tilt stage are connected via a tilt axis, and the tilt axis crosses two tilt axis holes at both sides of the tilt stage and is fixed to the tilt stage;

the tilt stage is of a bilaterally symmetric structure, and contains a combination of a U shape structure and a boss, and the boss is of a bilaterally symmetric structure, comprising a horizontal part and a tilted part at θ angle to the horizontal part, and the θ angle is 30-45 degrees; a rotary axis hole is arranged at a back end of the tilted part; one side of the horizontal part of the boss is provided with a boss slot, and a middle of the horizontal part is provided with a through hole for electron beam to permeate; the horizontal part of the boss is embedded between the U shape structure, and a fixed axis of the drive rod is provided at one end of the drive linkage, and a rotary axis is provided at the other end of the drive linkage, the boss is connected with the drive rod by the rotary axis and the drive linkage; two symmetric and through motion guide grooves are designed at both sides of the front-end of shaft, and the fixed axis of the drive rod is arranged in the motion guide grooves to guide the drive rod, restricting the drive rod to take a reciprocating motion back and forth in straight line under the drive of the linear stepping motor, further ensuring the tilt stage to rotate around the tilt axis;

a via hole is arranged at a front end of the piezoelectric ceramic loading stage, and a screw hole is arranged at a front end of the tilt stage, and the piezoelectric ceramic loading stage and the tilt stage are fixed together up and down, and the piezoelectric ceramic block and the piezoelectric ceramic loading stage are fixed; one end of the connecting base is connected with one end of the piezoelectric ceramic and the other end of the connecting base is connected with the sample loading stage.

2. The double-tilt in-situ mechanical sample holder for TEM based on piezoelectric ceramic drive according to claim 1, characterized in that: the sample loading stage is integrally formed by bulk silicon etching technology.

3. The double-tilt in-situ mechanical sample holder for TEM based on piezoelectric ceramic drive according to claim 1, wherein the sample loading stage comprises an outer frame and an inner frame, the inner frame comprises two mass blocks, two sample carrying platforms connected to the two mass blocks, and support beams connecting the two mass blocks with the outer frame.

4. The double-tilt in-situ mechanical sample holder for TEM based on piezoelectric ceramic drive according to claim 3, wherein a thickness of the two mass blocks, the two sample carrying platforms, and the support beams is not more than 60 μm.

5. The double-tilt in-situ mechanical sample holder for TEM based on piezoelectric ceramic drive according to claim 3, wherein the two mass blocks are two rectangular flat plates with a hook-like front end, the two sample carrying platforms have a triangle shape and are connected to the hook-like end, respectively.

* * * * *